United States Patent
Kim et al.

(10) Patent No.: US 10,636,339 B2
(45) Date of Patent: Apr. 28, 2020

(54) DISPLAY DEVICE AND METHOD OF TESTING DISPLAY DEVICE

(71) Applicant: Samsung Display Co., Ltd., Yongin-si, Gyeonggi-do (KR)

(72) Inventors: Hyunwoong Kim, Yongin-si (KR); Seungkyu Lee, Yongin-si (KR); Jongwon Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 59 days.

(21) Appl. No.: 15/888,987

(22) Filed: Feb. 5, 2018

(65) Prior Publication Data
US 2019/0073931 A1 Mar. 7, 2019

(30) Foreign Application Priority Data
Sep. 5, 2017 (KR) .......................... 10-2017-0113346

(51) Int. Cl.
| | |
|---|---|
| *G09G 3/00* | (2006.01) |
| *H01L 27/02* | (2006.01) |
| *H01L 27/12* | (2006.01) |
| *H01L 21/66* | (2006.01) |
| *G01R 1/36* | (2006.01) |
| *G01R 31/44* | (2020.01) |

(52) U.S. Cl.
CPC ............ *G09G 3/006* (2013.01); *G01R 1/36* (2013.01); *G01R 31/44* (2013.01); *H01L 22/34* (2013.01); *H01L 27/0296* (2013.01); *H01L 27/124* (2013.01); *H01L 27/1244* (2013.01); *G09G 2300/0426* (2013.01); *G09G 2330/04* (2013.01); *G09G 2330/12* (2013.01)

(58) Field of Classification Search
None
See application file for complete search history.

(56) References Cited

U.S. PATENT DOCUMENTS

| | | | |
|---|---|---|---|
| 8,553,017 B2 | 10/2013 | Jung et al. | |
| 2009/0262048 A1* | 10/2009 | Park | G09G 3/006 345/76 |
| 2009/0278835 A1* | 11/2009 | Ka | G09G 3/006 345/211 |

(Continued)

FOREIGN PATENT DOCUMENTS

| | | |
|---|---|---|
| KR | 10-2010-0100213 A | 9/2010 |
| KR | 10-2016-0043616 A | 4/2016 |

(Continued)

*Primary Examiner* — William Boddie
*Assistant Examiner* — Alecia D English
(74) *Attorney, Agent, or Firm* — Lewis Roca Rothgerber Christie LLP

(57) ABSTRACT

A display device includes a display unit that includes first pixels and second pixels alternately arranged in each of a first column and a third column, and third pixels arranged in a second column between the first column and the third column, wherein the first pixels and second pixels are alternately arranged in the third column in an order reverse to that of the first column. The display device includes a test unit in which first and second switches are coupled to columns including first pixels and second pixels alternatingly arranged. The first and second switches are spaced apart to prevent simultaneous damage from electrostatic discharge.

19 Claims, 11 Drawing Sheets

(56) References Cited

U.S. PATENT DOCUMENTS

| | | | |
|---|---|---|---|
| 2010/0020056 A1* | 1/2010 | Le Roy | G09G 3/3233 |
| | | | 345/211 |
| 2015/0091444 A1* | 4/2015 | Ebisuno | H05B 33/0896 |
| | | | 315/125 |
| 2016/0104402 A1 | 4/2016 | Kim | |
| 2016/0260367 A1 | 9/2016 | Kwak et al. | |
| 2017/0069239 A1 | 3/2017 | Kwon et al. | |

FOREIGN PATENT DOCUMENTS

| KR | 10-2016-0108639 A | 9/2016 |
|---|---|---|
| KR | 10-2017-0030102 A | 3/2017 |

\* cited by examiner

DISPLAY DEVICE AND METHOD OF TESTING DISPLAY DEVICE

CROSS-REFERENCE TO RELATED APPLICATION

This application claims priority to and the benefit of Korean Patent Application No. 10-2017-0113346, filed on Sep. 5, 2017, in the Korean Intellectual Property Office, the disclosure of which is incorporated herein in its entirety by reference.

BACKGROUND

1. Field

One or more embodiments relate to a display device and a method of testing the display device.

2. Description of the Related Art

Electrostatic discharge (ESD) may be generated in a substrate during a process of manufacturing a display device. When the ESD is generated, the ESD may be easily introduced by wires arranged at an edge of a display device, and thus semiconductor devices adjacent to the wires may be damaged.

SUMMARY

One or more embodiments include a display device which may reduce probability of defectiveness of a testing portion arranged at an edge of a display device due to the introduction of ESD.

Additional aspects will be set forth in part in the description which follows and, in part, will be apparent from the description, the appended claims, and/or the accompanying drawings.

According to one or more embodiments, a display device includes: a display unit including first pixels and second pixels alternately arranged in each of a first column and a third column, and third pixels arranged in a second column between the first column and the third column, wherein the first pixels and second pixels are alternately arranged in the third column in an order reverse to that of the first column (e.g., the first column begins with a first pixel and the third column begins with a second pixel); and a first test unit arranged around (e.g., at a side of) the display unit, and including a first transistor and a second transistor connected to a first fan-out line corresponding to a data line of the first column, and a third transistor and a fourth transistor connected to a third fan-out line corresponding to a data line of the third column, wherein the first transistor to the fourth transistor are arranged in a first direction, and the third transistor or the fourth transistor are arranged between the first transistor and the second transistor.

Among the first transistor, the second transistor, the third transistor, and the fourth transistor, the first transistor may be arranged farthest from an edge of the display device, and the third transistor or the fourth transistor that is not arranged between the first transistor and the second transistor may be arranged closest to the edge of the display device.

The display device may further include: a first control line arranged in a second direction that crosses (e.g., is perpendicular to) the first direction; a second control line arranged parallel to the first control line; a third control line arranged parallel to the second control line; a first test signal line arranged between the first control line and the second control line; and a second test signal line arranged between the second control line and the third control line, wherein the second control line and the third control line may be electrically connected to each other (or may otherwise receive the same signal).

In the first transistor, a gate electrode may be connected to the first control line, a first electrode may be connected via a contact portion to the first fan-out line arranged in the first direction, and a second electrode may be connected to the first test signal line. In the second transistor, a gate electrode may be connected to the second control line, a first electrode may be connected via a contact portion to the first fan-out line, and a second electrode may be connected to the second test signal line.

In the third transistor, a gate electrode may be connected to the second control line, a first electrode may be connected via a contact portion to the third fan-out line arranged in the first direction, and a second electrode may be connected to the first test signal line. In the fourth transistor, a gate electrode may be connected to the third control line, a first electrode may be connected via a contact portion to the third fan-out line, and a second electrode may be connected to the second test signal line.

Each of the first transistor and the third transistor may share the first test signal line as one electrode.

Each of the second transistor and the fourth transistor may share the second test signal line as one electrode.

The display device may further include: a fourth control line arranged parallel to the first control line; and a third test signal line arranged between the first control line and the fourth control line, wherein the fourth control line is arranged closer to the display unit than the first control line.

The first test unit may further include a fifth transistor in which a gate is connected to the fourth control line, a first electrode is connected to a second fan-out line corresponding to a data line of the second column, and a second electrode is connected to the third test signal line.

The display device may further include an electrostatic induction unit connected to the first test unit.

The electrostatic induction unit may include sixth transistors, each connected to the first fan-out line or the third fan-out line and maintaining (e.g., being maintained in) a turn-off state.

The display device may further include a second test unit connected to the first test unit, wherein the second test unit includes: a seventh transistor connected to the first fan-out line; an eighth transistor connected to a second fan-out line corresponding to a data line of the second column; a ninth transistor connected to the third fan-out line; and a tenth transistor connected to a fourth fan-out line corresponding to a data line of the fourth column next to the third column, wherein the seventh transistor and the eighth transistor are connected to a fourth test signal line that applies a fourth test signal, and the ninth transistor and the tenth transistor are connected to a fifth test signal line that applies a fifth test signal.

A data pad may be arranged between the first test unit and the second test unit.

According to one or more embodiments, there is provided a method of testing a display device, the display device including a display unit, and a first test unit and a second test unit around (e.g., at a side of) the display unit, wherein the display unit includes first pixels and second pixels alternately arranged in each of a first column and a third column, and third pixels arranged in a second column between the first column and the third column and in a fourth column adjacent to the third column, wherein the first pixels and second pixels are alternately arranged in the third column in an order reverse to that of the first column (e.g., the first column begins with a first pixel and the third column begins with a second pixel), the method including: applying first gradation data to data lines of the first column, the second column, the third column, and the fourth column via the second test unit in a first section (e.g., a first section of time); applying second gradation data to data lines of the first column, the second column, the third column, and the fourth column via the first test unit in a second section (e.g., a second section of time); and applying a scan signal to the display unit in (e.g., during) the second section.

The first test unit may include a first transistor and a second transistor connected to a first fan-out line corresponding to a data line of the first column, and a third transistor and a fourth transistor connected to a third fan-out line corresponding to a data line of the third column, the first transistor, the second transistor, the third transistor, and the fourth transistor may be arranged in a first direction, and the third transistor or the fourth transistor may be arranged between the first transistor and the second transistor.

Among the first transistor, the second transistor, the third transistor, and the fourth transistor, the first transistor may be arranged farthest from an edge of the display device, and the third transistor or the fourth transistor that is not arranged between the first transistor and the second transistor may be arranged closest to the edge of the display device.

One electrode of the first transistor and one electrode of the second transistor may be connected to the first fan-out line via a contact portion, and one electrode of the third transistor and one electrode of the fourth transistor may be connected to the third fan-out line via a contact portion.

The first test unit may further include a fifth transistor connected to a second fan-out line corresponding to a data line of the second column.

The method may further include an electrostatic induction unit connected to the first test unit.

The electrostatic induction unit may further include sixth transistors, each connected to the first fan-out line or the third fan-out line and maintaining (e.g., being maintained in) a turn-off state.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
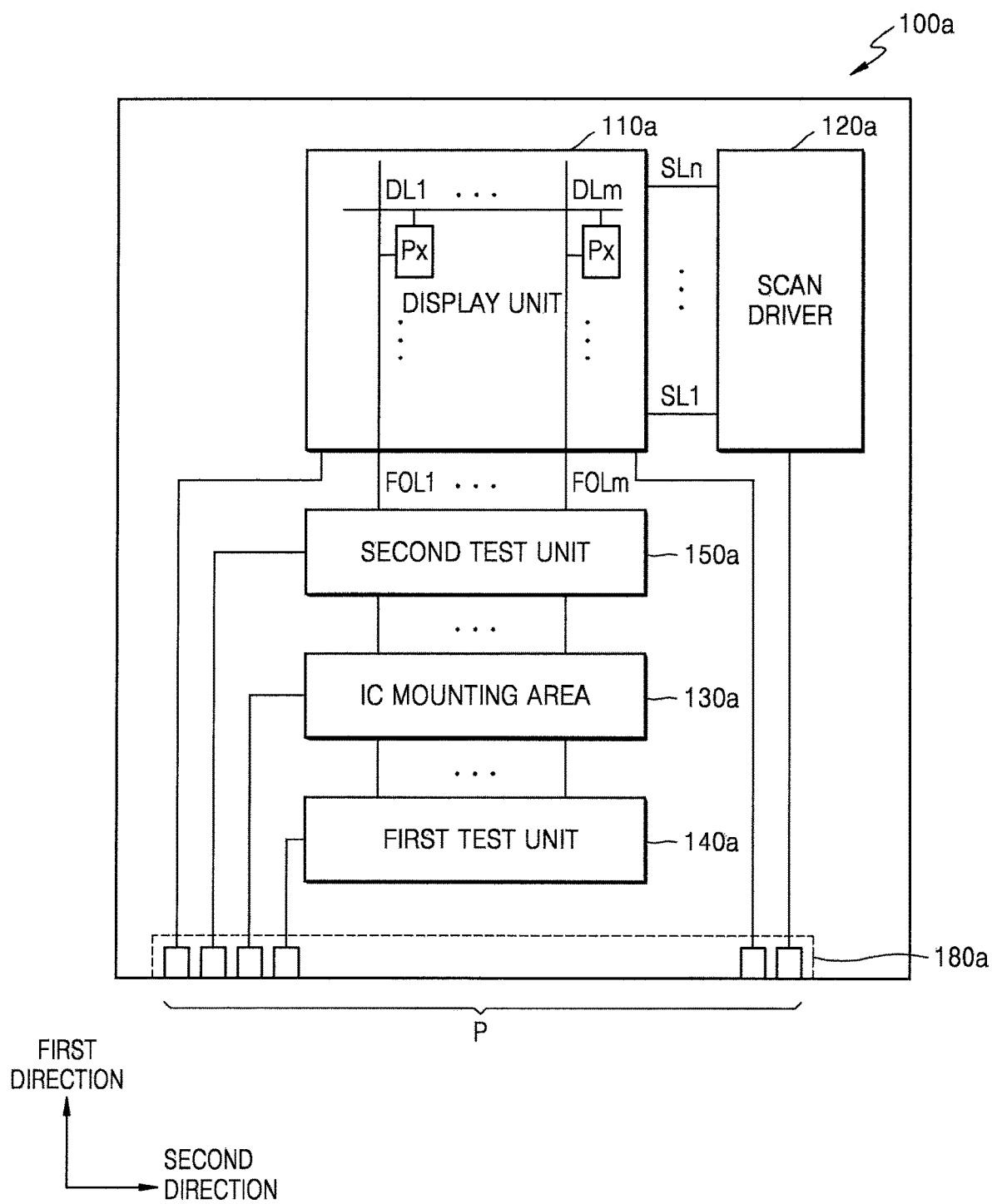
FIG. 1 is a plan view schematically illustrating a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

As used herein, the term "and/or" includes any and all combinations of one or more of the associated listed items.

In the present embodiment below, terms such as "first" and "second" are used herein merely to describe a variety of constituent elements, but the constituent elements are not limited by the terms. Such terms are used only for the purpose of distinguishing one constituent element from another constituent element. As used herein, the singular forms "a," "an" and "the" are intended to include the plural forms as well, unless the context clearly indicates otherwise.

It will be further understood that the terms "comprises," "comprising," "includes," and/or "including" used herein specify the presence of stated features or components, but do not preclude the presence or addition of one or more other features or components.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

FIG. 1 is a plan view schematically illustrating a display device 100a according to an embodiment.

Referring to FIG. 1, the display device 100a according to the present embodiment may include a display unit 110a, a scan driver 120a, an IC mounting area 130a, a first test unit 140a, a second test unit 150a, and a pad unit 180a.

The display device 100a may include (e.g. may be) various types of display devices, such as organic light-emitting display devices, liquid crystal display devices, field emission display devices (FEDs), etc.

The display unit 110a may include, in a display area, a plurality of pixels PX positioned at crossing regions of a plurality of data lines DL1 to DLm and a plurality of scan lines SL1 to SLn and emitting lights of different colors. The data lines DL1 to DLm are arranged in a first direction, and the scan lines SL1 to SLn are arranged in a second direction. In the following description, reference numerals are indexed from the left for convenience of explanation.

The scan driver 120a, the IC mounting area 130a, the first test unit 140a, the second test unit 150a, and the pad unit 180a are arranged in a non-display area around the display unit 110a.

The scan driver 120a generates a scan signal in response to scan driving power and a scan control signal supplied from the outside (e.g., outside the display unit 100a), and sequentially supplies the generated scan signals to the scan lines SL1 to SLn.

A plurality of data pads (not shown) respectively connected to a plurality of fan-out lines FOL1 to FOLm extending from the data lines DL1 to DLm of the display unit 110a are arranged in the IC mounting area 130a. A data driver is bonded to the data pads in a chip on glass (COG) method and mounted in the IC mounting area 130a. The data driving unit generates a data signal in response to display data and a data control signal, and supplies the generated data signals to the data lines DL1 to DLm.

The IC mounting area 130a is arranged between the first test unit 140a and the second test unit 150a.

The first test unit 140a may be arranged between the IC mounting area 130a and the pad unit 180a. The first test unit 140a performs a lighting test to detect whether a pixel is defective. The first test unit 140a receives a lighting test signal and a lighting test control signal, and supplies, in response to the lighting test control signal, the lighting test signal to the data lines DL1 to DLm via the fan-out lines FOL1 to FOLm.

The second test unit 150a may be arranged between the display unit 110a and the IC mounting area 130a. The second test unit 150a may detect a short circuit, a resistance defect, and/or an open circuit of the fan-out lines FOL1 to FOLm, that is, lines connecting the data lines DL1 to DLm of the display unit 110a and the data pads of the IC mounting area 130a. The detection of a resistance defect may be detecting a vertical line defect occurring on a screen according to an increase in the resistance by a crack in the fan-out lines FOL1 to FOLm. The second test unit 150a receives a line test signal and a line test control signal, and supplies, in response to the line test control signal, the line test signal to the data lines DL1 to DLm via the fan-out lines FOL1 to FOLm.

The first test unit 140a and the second test unit 150a each may include a plurality of switching elements that receive a test control signal and a test signal. To improve manufacturing efficiency, the switching elements may be formed during a process of forming transistors provided in a pixel circuit of the display unit 110a, to have the same structure.

The fan-out lines FOL1 to FOLm may include the odd-numbered fan-out lines FOL1, FOL3, . . . , FOLm−1 and the even-numbered fan-out lines FOL2, FOL4, . . . , FOLm.

In an embodiment, the fan-out lines FOL1 to FOLm may be arranged in the same layer. In another embodiment, the odd-numbered fan-out lines FOL1, FOL3, . . . , FOLm−1 and the even-numbered fan-out lines FOL2, FOL4, . . . , FOLm may be arranged in different layers with at least one insulating film interposed therebetween. For example, the odd-numbered fan-out lines FOL1, FOL3, . . . , FOLm−1 may be arranged adjacent to each other in a lower layer, at least one insulating film is formed above the odd-numbered fan-out lines FOL1, FOL3, . . . , FOLm−1, and the even-numbered fan-out lines FOL2, FOL4, . . . , FOLm may be arranged adjacent to each other in a layer above the at least one insulating film. In this case, the even-numbered fan-out lines FOL2, FOL4, . . . , FOLm may be respectively arranged between the odd-numbered fan-out lines FOL1, FOL3, . . . , FOLm−1. In another embodiment, the even-numbered fan-out lines FOL2, FOL4, . . . , FOLm are arranged in a lower layer adjacent each other, at least one insulating film is formed above the even-numbered fan-out lines FOL2, FOL4, . . . , FOLm, and the odd-numbered fan-out lines FOL1, FOL3, . . . , FOLm−1 may be arranged adjacent to each other in a layer above the at least one insulating film.

The pad unit 180a may include a plurality of pads P for transmitting powers and/or signals supplied from the outside to the inside of the display device 100a. Because the position and the number of lines connecting the pad unit 180a and the respective constituent elements of the display device 100a depicted in FIG. 1 are illustrated for convenience of explanation, the lines may be arranged at different positions. For example, the line through which signals are supplied from the pad unit 180a to the scan driver 120a may include four lines through which scan driving power, and a start pulse, a scan clock signal and an output enable signal, as a scan control signal are received.

Although in the embodiment of FIG. 1 the scan driver 120a is illustrated as being located at the right side, the present embodiment is not limited thereto and the scan driving unit 120a may be provided at the left side or both the left and right sides.

Figure 2:
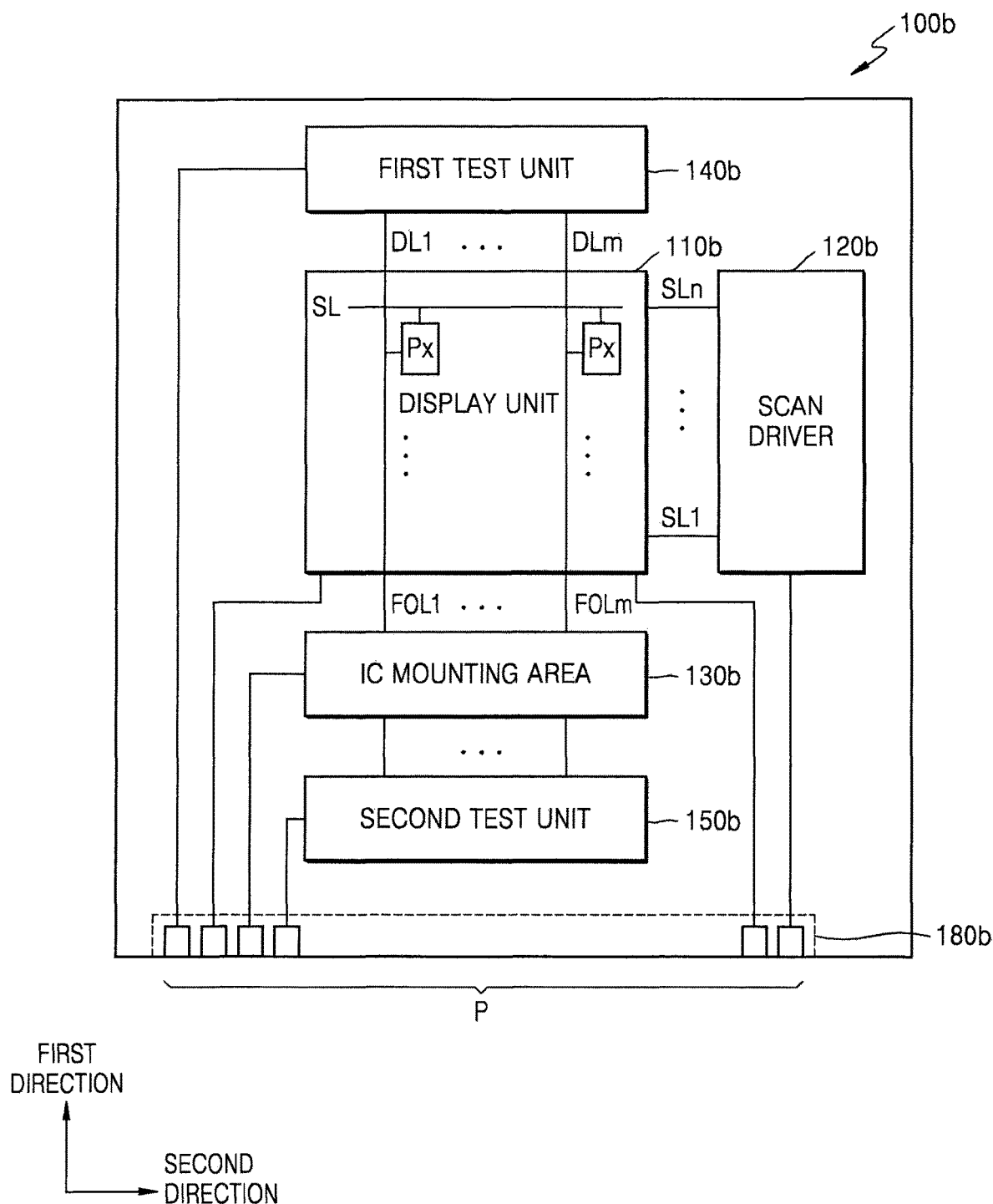
FIG. 2 is a plan view schematically illustrating a display device according to another embodiment.

FIG. 2 is a plan view schematically illustrating a display device 100b according to another embodiment.

Referring to FIG. 2, the display device 100b according to the present embodiment may include a display unit 110b, a scan driver 120b, an IC mounting area 130b, a first test unit 140b, a second test unit 150b, and a pad unit 180b.

In the embodiment of FIG. 2, the arrangement of the first test unit 140b and the second test unit 150b is different from the arrangement of the first test unit 140a and the second test unit 150a according to the embodiment of FIG. 1. In the embodiment of FIG. 2, the display unit 110b and the IC mounting area 130b are arranged between the first test unit 140b and the second test unit 150b. The first test unit 140b is arranged in an upper side of the display unit 110b, and the second test unit 150b is arranged between the IC mounting area 130b and the pad unit 180b. Because the configuration and function of the display device 100b in the embodiment of FIG. 2 are the same as those of the embodiment in FIG. 1, except for the difference in the arrangement, detailed descriptions thereof are omitted.

Figure 3:
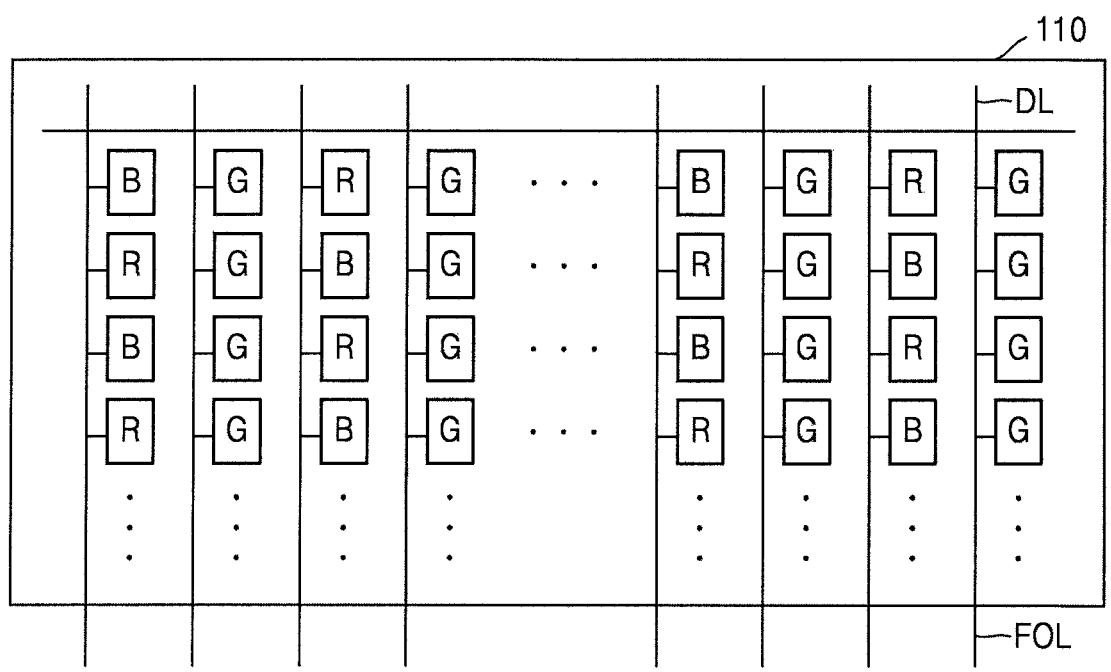
FIG. 3 is a plan view illustrating an example of a display unit illustrated in FIGS. 1-2.

FIG. 3 is a plan view illustrating an example of the display units 110a and 110b illustrated in FIGS. 1 and 2.

Referring to FIG. 3, a display unit 110, which corresponds to the display units 110a and 110b, may include first pixels, second pixels, and third pixels, which emit lights of different colors (e.g., first pixels may emit a light of a first color, second pixels may emit a light of a second color, and third pixels may emit a light of a third color). In the display unit 110, the first pixels and the second pixels are alternately arranged in the same column, and the third pixels are arranged in a column adjacent to the column where the first pixel and the second pixel are arranged.

A first pixel may be set to be a red pixel R emitting a red light, a second pixel may be set to be a blue pixel B emitting a blue light, and a third pixel may be set to be a green pixel G emitting a green light.

The red pixel R and the blue pixel B are alternately arranged in the same column, and the green pixel G is arranged in a row in a column adjacent to the column where the red pixel R and the blue pixel B are arranged.

In this state, the red pixel R and the blue pixel B are arranged such that the red pixels R and the blue pixels B are located in a diagonal direction in a check board form with respect to the column where the green pixel G is arranged. In other words, the red pixel R and the blue pixel B are alternately arranged in two neighboring rows not to be repeatedly arranged in the same column. The data lines DL1 to DLm are arranged in each column. In FIG. 3, the scan lines SL1 to SLn are omitted for convenience of explanation.

In an embodiment, although the display unit 110 is described to be configured with the red pixel R, the blue pixel B, and the green pixel G, the display unit 110 may further include a pixel (not shown) for producing a light of a color other than red, green, and blue.

Figure 4:
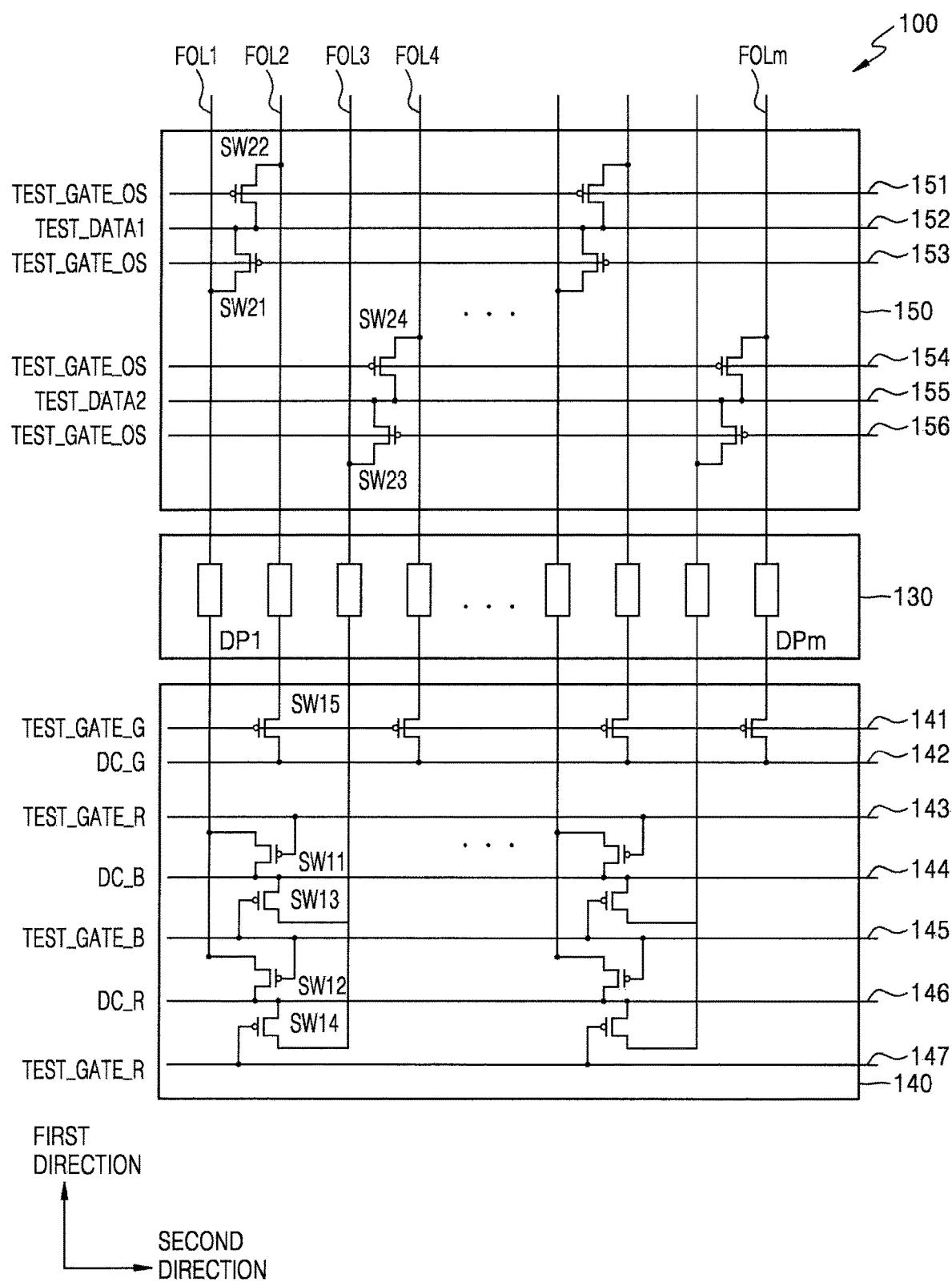
FIG. 4 is a plan view illustrating an example of a display device according to an embodiment.

FIG. 4 is a plan view illustrating an example of a display device 100 according to an embodiment.

The display device 100 of FIG. 4 may be the display device 110a of FIG. 1 or the display device 100b of FIG. 2.

Referring to FIG. 4, a first test unit 140, which corresponds to the first test units 140a and 140b, may be arranged at one side of an IC mounting area 130, which corresponds to the IC mounting areas 130a and 130b, and a second test unit 150, which corresponds to the second test units 150a and 150b, may be arranged at the other side thereof. In FIG. 4, the display unit 110, which corresponds to the display units 110a and 110b, are omitted for convenience of explanation.

A plurality of data pads DP connected to the fan-out lines FOL1 to FOLm extending from the data lines DL1 to DLm are arranged in the IC mounting area 130.

The first test unit 140 may include a first switch SW11 and a second switch SW12 connected to the first fan-out line FOL1 corresponding to the data line of the first column in which the first pixels and the second pixels are alternately arranged, a third switch SW13 and a fourth switch SW14 connected to the third fan-out line FOL3 corresponding to the data line of the third column in which the first pixels and the second pixels are alternately arranged in the reverse order to that of the first column, and a fifth switch SW15 connected to the second fan-out line FOL2 corresponding to the data line of the second column in which the third pixels are arranged.

The first switch SW11, the second switch SW12, the third switch SW13, and the fourth switch SW14 are repeatedly arranged in the second direction. For example, additional switches corresponding to the first switch SW11, the second switch SW12, the third switch SW13, and the fourth switch SW14 may be coupled to additional fan-out lines repeatedly arranged in the second direction.

The switches may be arranged in a method in which the third switch SW13 or the fourth switch SW14 is arranged between the first switch SW11 and the second switch SW12, that is, the first switch SW11, the third switch SW13, the second switch SW12, and the fourth switch SW14 are sequentially arranged in the first direction. Accordingly, the first switch SW11 may be located farthest from the edge of the display device 100, and the fourth switch SW14 may be located closest to the edge of the display device 100.

In the first switch SW11, a gate is connected to a first control line 143 through which a first lighting test control signal TEST_GATE_R is supplied, a first terminal is connected to the first fan-out line FOL1, and a second terminal is connected to a first test signal line 144 through which a first lighting test signal DC_B is supplied.

In the second switch SW12, a gate is connected to a second control line 145 through which a second lighting test control signal TEST_GATE_B is supplied, a first terminal is connected to the first fan-out line FOL1, and a second terminal is connected to a second test signal line 146 through which a second lighting test signal DC_R is supplied.

The first terminals of the first switch SW11 and the second switch SW12 may be arranged spaced apart from each other, and may be respectively electrically connected to the first fan-out line FOL1 by contacting the same.

In the third switch SW13, a gate is connected to the second control line 145 through which the second lighting test control signal TEST_GATE_B is supplied, a first terminal is connected to the third fan-out line FOL3, and a second terminal is connected to the first test signal line 144 through which the first lighting test signal DC_B is supplied.

In the fourth switch SW14, a gate is connected to a third control line 147 through which the first lighting test control signal TEST_GATE_R is supplied, a first terminal is connected to the third fan-out line FOL3, and a second terminal is connected to the second test signal line 146 through which the second lighting test signal DC_R is supplied.

The first terminals of the third switch SW13 and the fourth switch SW14 may be arranged spaced apart from each other, and may be respectively electrically connected to the third fan-out line FOL3 by contacting the same.

The first control line 143 and the third control line 147 may be electrically connected to each other, and thus the first lighting test control signal TEST_GATE_R may be supplied through each of the first control line 143 and the third control line 147.

The fifth switch SW15 is repeatedly arranged in the second direction farther from the edge of the display device 100 than the first switch SW11 to the fourth switch SW14. For example, additional switches corresponding to the fifth switch SW15 may be coupled to additional fan-out lines repeatedly arranged in the second direction In the fifth switch SW15, a gate is connected to a fourth control line 141 through which a third lighting test control signal TEST_GATE_G is supplied, a first terminal is connected to the second fan-out line FOL2, and a second terminal is connected to a third test signal line 142 through which a third lighting test signal DC_G is supplied.

The second test unit 150 may include a sixth switch SW21 connected to the first fan-out line FOL1, a seventh switch SW22 connected to the second fan-out line FOL2, an eighth switch SW23 connected to the third fan-out line FOL3, and a ninth switch SW24 connected to a fourth fan-out line FOL4 corresponding to a data line of the fourth column where the third pixels are arranged.

The sixth switch SW21, the seventh switch SW22, the eighth switch SW23, and the ninth switch SW24 are repeatedly arranged in the second direction. For example, additional switches corresponding to the sixth switch SW21, the seventh switch SW22, the eighth switch SW23, and the ninth switch SW24 may be coupled to additional fan-out lines repeatedly arranged in the second direction.

In the sixth switch SW21, a gate is connected to a fifth control line 153 through which a line test control signal TEST_GATE_OS is supplied, a first terminal is connected to the first fan-out line FOL1, and a second terminal is connected to a fourth test signal line 152 through which a first line test signal TEST_DATA1 is supplied.

In the seventh switch SW22, a gate is connected to a sixth control line 151 through which the line test control signal TEST_GATE_OS is supplied, a first terminal is connected to the second fan-out line FOL2, and a second terminal is connected to the fourth test signal line 152 through which the first line test signal TEST_DATA1 is supplied.

In the eighth switch SW23, a gate is connected to a seventh control line 156 through which the line test control signal TEST_GATE_OS is supplied, a first terminal is connected to the third fan-out line FOL3, and a second terminal is connected to a fifth test signal line 155 through which a second line test signal TEST_DATA2 is supplied.

In the ninth switch SW24, a gate is connected to an eighth control line 154 through which the line test control signal TEST_GATE_OS is supplied, a first terminal is connected to the fourth fan-out line FOL4, and a second terminal is connected to the fifth test signal line 155 through which the second line test signal TEST_DATA2 is supplied.

The fifth to eighth control lines 153, 151, 156, and 154 may be electrically connected to one another, and the line test control signal TEST_GATE_OS is supplied through each of the fifth to eighth control lines 153, 151, 156, and 154.

The first to fifth switches SW11 to SW15 and the sixth to ninth switches SW21 to SW24 may be implemented by transistors. The gate, first terminal, and second terminal of each of the first to fifth switches SW11 to SW15 and each of the sixth to ninth switches SW21 to SW24 correspond to a gate electrode, a first electrode, and a second electrode of each transistor. The first electrode and the second electrode may be a source electrode and a drain electrode of each transistor. In the following description, the switch and the transistor may be mixedly described.

Figure 5:
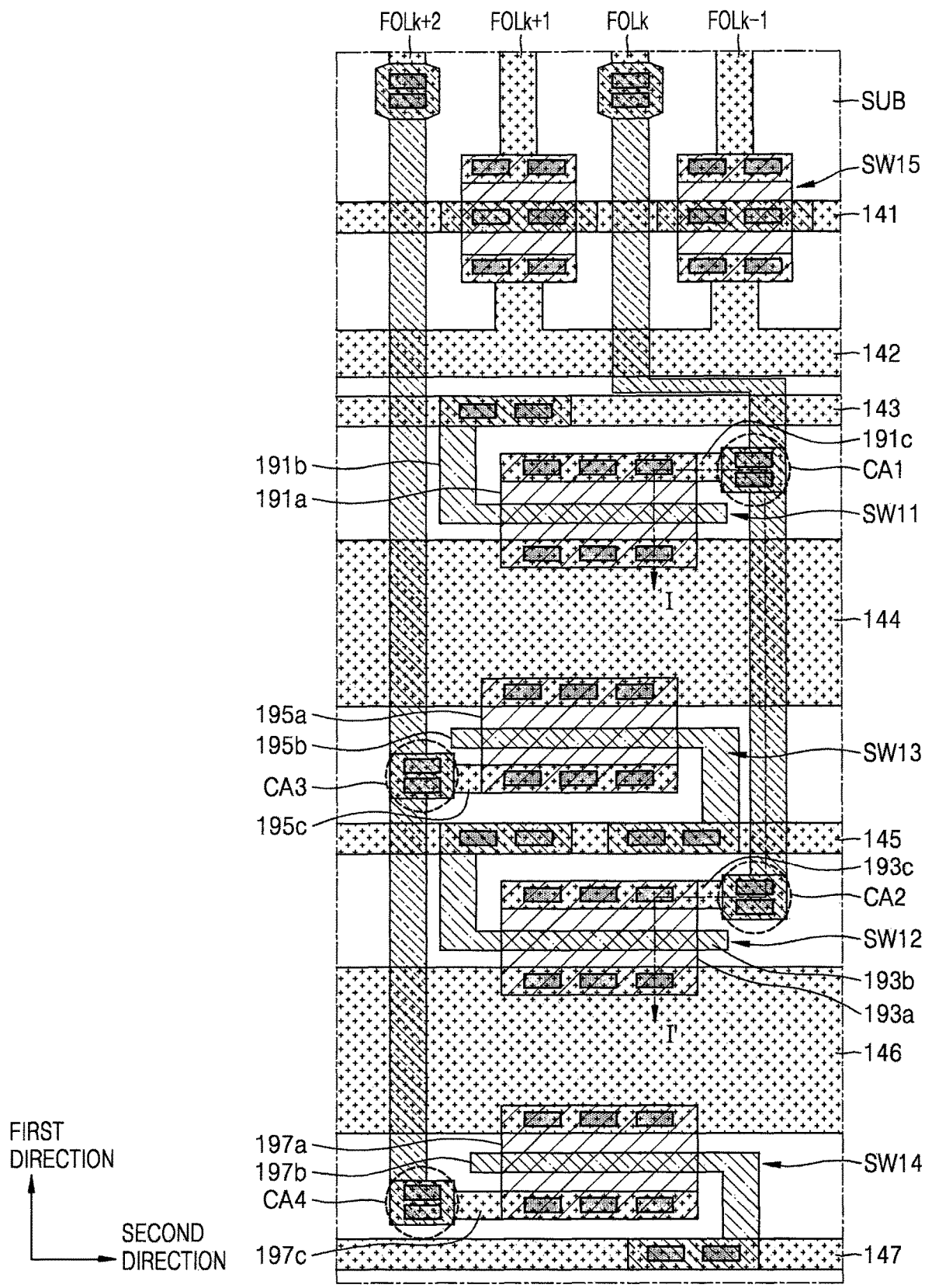
FIG. 5 is a plan view illustrating a part of a first test unit illustrated in FIG. 4.
Figure 6:
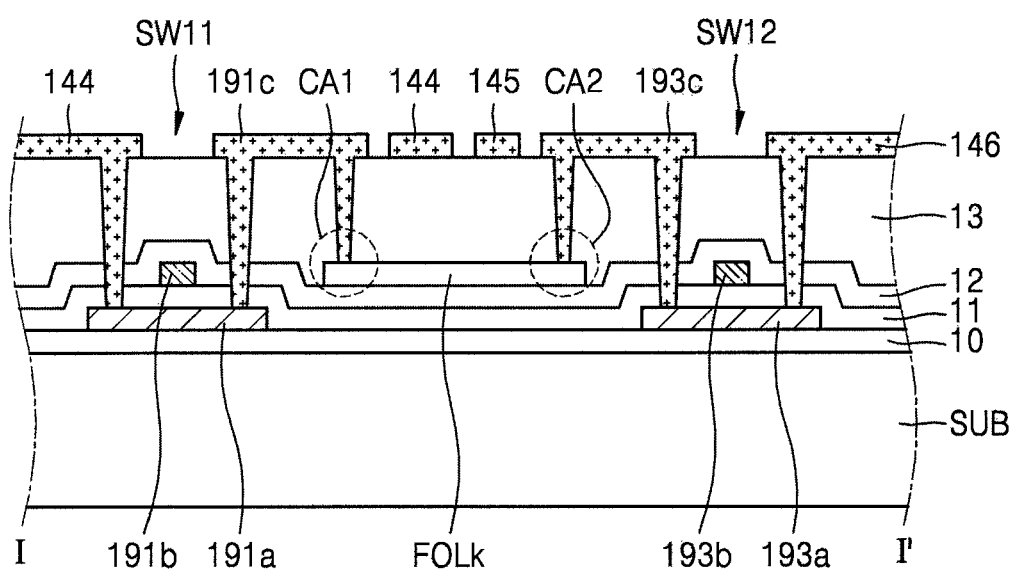
FIG. 6 is a cross-section taken along line I-I' of FIG. 5.

FIG. 5 is a plan view illustrating a part of the first test unit 140 illustrated in FIG. 4. FIG. 6 is a cross-section taken along line I-I' of FIG. 5. In the following description, both of FIGS. 5 and 6 are referred to.

FIG. 5 illustrates an example in which the first to fifth switches SW11 to SW15 of the first test unit 140 are implemented by first to fifth transistors and arranged. In the following description, the first to fifth switches SW11 to SW15 are referred to as the first to fifth transistors SW11 to SW15. The sixth to ninth switches SW21 to SW24 may also be referred to as the sixth to ninth transistors SW21 to SW24.

Fan-out lines FOLk−1, FOLk, FOLk+1, FOLk+2 . . . , the first to fourth control lines 143, 145, 147, and 141, and the first to third test signal lines 144, 146, and 142 are arranged on a substrate SUB.

The fan-out lines FOLk−1, FOLk, FOLk+1, FOLk+2 . . . are arranged spaced apart from each other and extend in the first direction. The first fan-out line FOLk is connected to a data line of the first column in which the first pixels and the second pixel are alternately arranged. The second fan-out line FOLk+1 is connected to a data line of the second column in which the third pixels are arranged. The third fan-out line FOLk+2 is connected to a data line of the third column in which the first pixels and the second pixels are alternately arranged in the reverse order to that of the first column.

The first to fourth control lines 143, 145, 147, and 141 and the first to third test signal lines 144, 146, and 142 are arranged spaced apart from each other and extend in the second direction.

A buffer layer 10 is arranged on the substrate SUB, and the first to fifth transistors SW11 to SW15 are arranged on the buffer layer 10 in the first direction. The buffer layer 10 may be omitted.

A first insulating layer 11 is arranged between semiconductor layers and gate electrodes of the first to fifth transistors SW11 to SW15, a second insulating layer 12 and a third insulating layer 13 are arranged over the gate electrodes, and the first electrodes and the second electrodes are arranged over the third insulating layer 13. The fan-out lines are arranged over the second insulating layer 12, and the third insulating layer 13 is arranged over the fan-out lines. The first to fourth control lines 143, 145, 147, and 141 and the first to third test signal lines 144, 146, and 142 are arranged over the third insulating layer 13.

The first transistor SW11 may include a semiconductor layer 191a, a gate electrode 191b connected to the first control line 143, and a first electrode 191c and a second electrode respectively connected to both ends of the semiconductor layer 191a. The first electrode 191c may be electrically connected to the first fan-out line FOLk by contacting the same in a contact portion CA1. The second electrode may be a part of the first test signal line 144.

The second transistor SW12 may include a semiconductor layer 193a, a gate electrode 193b connected to the second control line 145, and a first electrode 193c and a second electrode respectively connected to both ends of the semiconductor layer 193a. The first electrode 193c may be electrically connected to the first fan-out line FOLk by contacting the same in a contact portion CA2. The second electrode may be a part of the second test signal line 146.

The third transistor SW13 may include a semiconductor layer 195a, a gate electrode 195b connected to the second control line 145, and a first electrode 195c and a second electrode respectively connected to both ends of the semiconductor layer 195a. The first electrode 195c may be electrically connected to the third fan-out line FOLk+2 by contacting the same in a contact portion CA3. The second electrode may be a part of the first test signal line 144.

The fourth transistor SW14 may include a semiconductor layer 197a, a gate electrode 197b connected to the third control line 147, and a first electrode 197c and a second electrode respectively connected to both ends of the semiconductor layer 197a. The first electrode 197c may be electrically connected to the third fan-out line FOLk+2 by contacting the same in a contact portion CA4. The second electrode may be a part of the second test signal line 146.

The first transistor SW11 and the second transistor SW12 may be arranged spaced apart by a certain distance from each other with the third transistor SW13 interposed therebetween. The third transistor SW13 and the fourth transistor SW14 are arranged spaced apart by a certain distance with the second transistor SW11 interposed therebetween.

Because the transistors of the first test unit 140 arranged at the non-display area of the display device 100 are easily exposed to electrostatic discharge (ESD) introduced from the outside (e.g., from sources outside the display device), the transistors may be easily damaged by the ESD in a module form during a manufacturing process or after the process is completed. In the first test unit 140, the transistor located closest to the edge of the display device 100 may be easily damaged by the ESD. When the transistors of the first test unit 140 are damaged by the ESD, the lighting test may not be effectively performed and a display device driving defect may occur.

Figure 7:
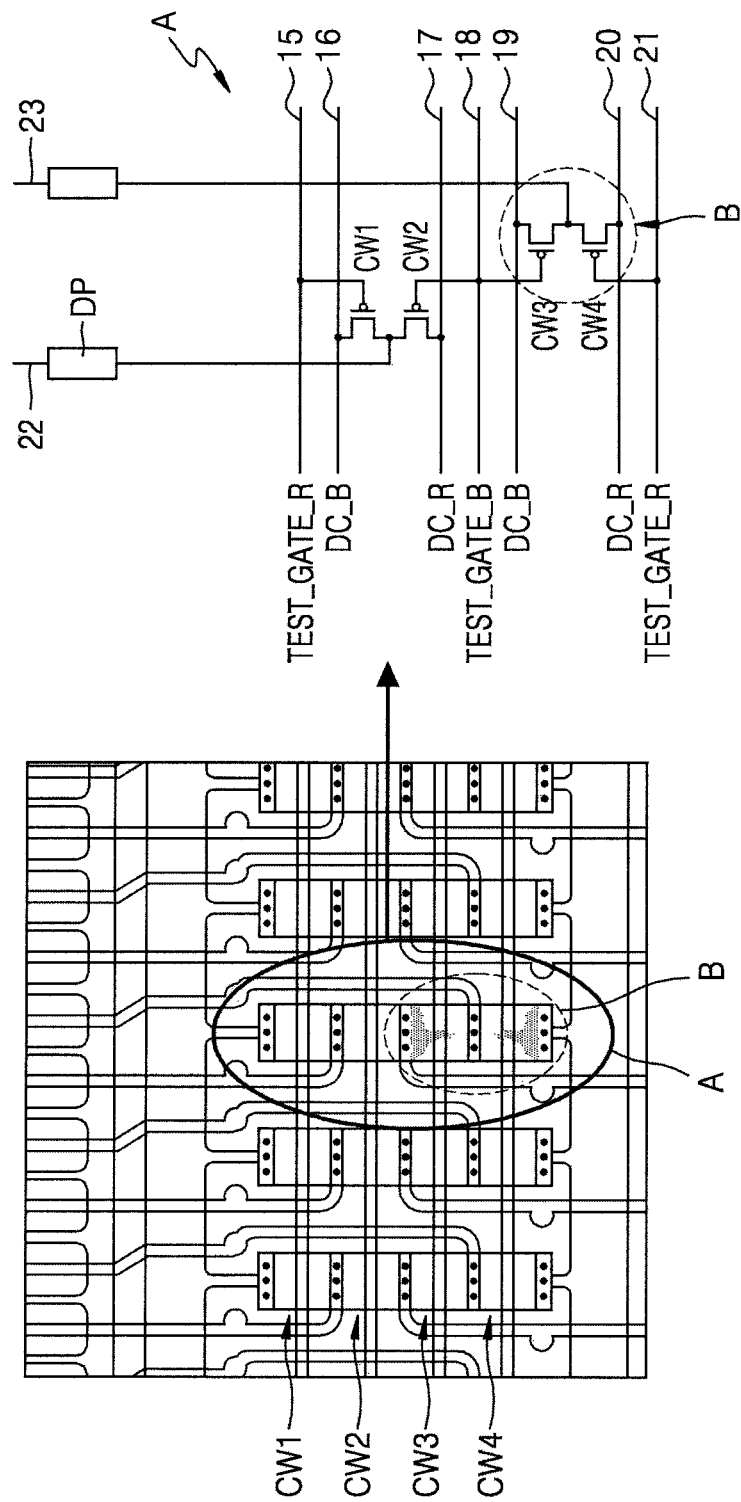
FIG. 7 illustrates an arrangement of switches for a lighting test according to a comparative example.

FIG. 7 illustrates an arrangement of switches for a lighting test according to a comparative example.

Referring to FIG. 7, at one side of the periphery of the display device 100, a pair of transistors (switches) for a lighting test may be connected to a fan-out line 22 corresponding to a first column in which the two first and second pixels are alternately arranged and a fan-out line 23 corresponding to a third column in which the first and second pixels are alternately arranged in the reverse order to that of the first column.

A pair of a first transistor CW1 and a second transistor CW2 are serially connected to the fan-out line 22. The first transistor CW1 and the second transistor CW2 share a first electrode.

A pair of a third transistor CW3 and a fourth transistor CW4 are serially connected to the fan-out line 23. The third transistor CW3 and the fourth transistor CW4 share a first electrode.

The third transistor CW3 and the fourth transistor CW4 are located closer to the edge of the display device 100 than the first transistor CW1 and the second transistor CW2.

Accordingly, when the ESD is introduced, the third transistor CW3 and the fourth transistor CW4 that are located close to the edge of the display device 100 and connected serially may be simultaneously damaged (area B). In this case, it is a problem that it is difficult to perform a lighting test on pixels connected to the data line corresponding to the fan-out line 23.

When two different pixels are alternately arranged in one column, two transistors for supplying two test signals are needed for a lighting test. In this case, as illustrated in FIG. 7, when two transistors are designed to be connected serially while sharing one electrode, the two transistors close to the edge of the display device 100 may be simultaneously damaged due to the introduction of ESD. In this case, it is difficult to perform a lighting test on the column.

In the present embodiment, a pair of test transistors connected to a column in which two different pixels are alternately arranged are arranged spaced apart by a certain distance from each other, formed independently without sharing an electrode, and electrically connected to the fan-out line by individually contacting the same. Furthermore, the pair of test transistors are arranged alternately with another pair of test transistors adjacent thereto.

Accordingly, according to an embodiment, by allowing only one of the two transistors connected to one column to be exposed to the ESD, a probability of defectiveness of a test unit due to the simultaneous damage of the two transistors connected to one column may be reduced. For example, even when the second transistor SW12 and the fourth transistor SW14 close to the edge of the display device 100 in FIGS. 4 and 5 are damaged due to the introduction of ESD, a lighting test is possible by using the first transistor SW11 and the third transistor SW13.

Figure 8:
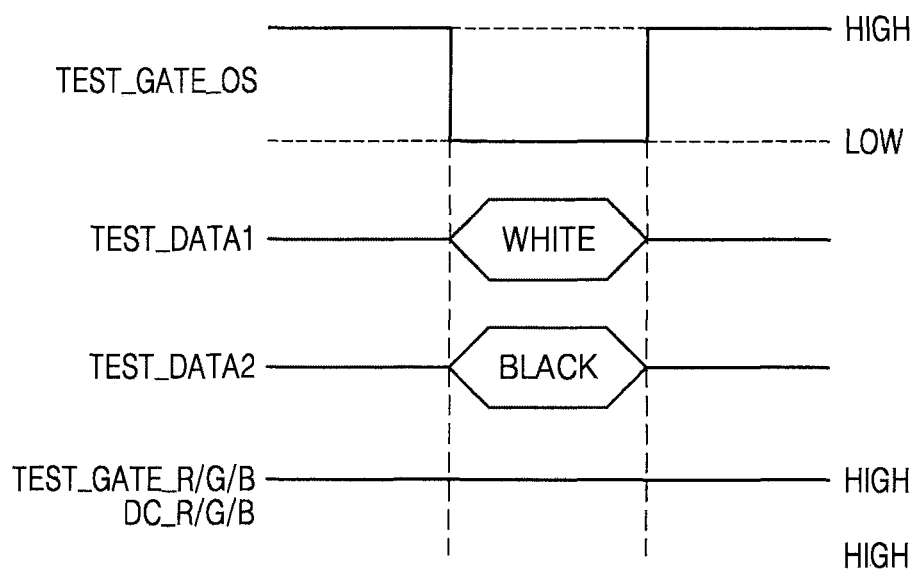
FIGS. 8-9 are timing diagrams for explaining a test process for detecting short-circuits in the display device of FIG. 4.
Figure 9:
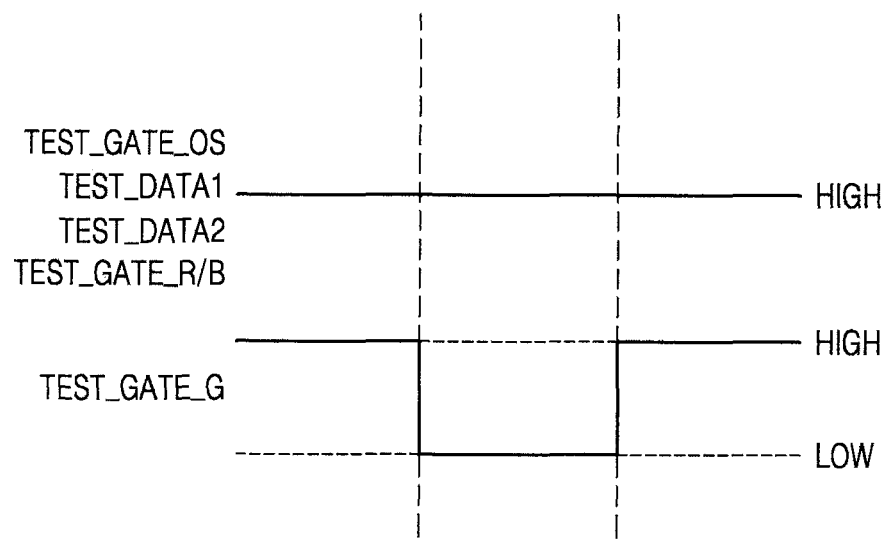

FIGS. 8 and 9 are timing diagrams for explaining a test process for detecting short-circuits in the display device 100 of FIG. 4.

Referring to FIG. 8, the detection of short-circuits between the adjacent fan-out lines (FOL1 and FOL3, FOL2 and FOL4, etc.) in the same layer may be performed by the second test unit 150.

During the detection of short-circuits, the first test unit 140 may be deactivated. The lighting test control signals TEST_GATE_R/G/B and the lighting test signals DC_R/G/B of a high level may be applied to the first test unit 140.

Then, the line test control signal TEST_GATE_OS of a low level is applied to the gates of the sixth switch SW21 to the ninth switch SW24 so that the sixth switch SW21 to the ninth switch SW24 are turned on. The second test unit 150 applies line test signals of different gradations to adjacent fan-out lines in the same layer. For example, second gradation data may be applied, as the first line test signal TEST_DATA1, to the sixth switch SW21 and the seventh switch SW22 via the fourth test signal line 152, and first gradation data may be applied, as a second line test signal TEST_DATA2, to the eighth switch SW23 and the ninth switch SW24 via the fifth test signal line 155. The first gradation data may be white data, and the second gradation data may be black data.

When the fan-out lines (FOL1 and FOL3, FOL2 and FOL4, etc.) that are adjacent to each other in the same layer have short-circuits, the data line connected to the fan-out lines may have a current value or a voltage value corresponding to gradation data different from the first gradation data and the second gradation data.

Referring to FIG. 9, the detection of short-circuits between closely adjacent fan-out lines (FOL1 and FOL2, FOL2 and FOL3, etc.) may be performed by the first test unit 140.

During the detection of short-circuits, the second test unit 150 may be deactivated. The line test control signal TEST_GATE_OS and the first and second line test signals TEST_DATA1 and TEST_DATA2 of a high level may be applied to the second test unit 150.

Then, the first and second lighting test control signals TEST_GATE_R and TEST_GATE_B of high level may be applied to the gates of the first to fourth switches SW11 to SW14, and the third lighting test control signal TEST_GATE_G of a low level may be applied to the gate of the fifth switch SW15. Accordingly, the first to fourth switches SW11 to SW14 are turned off, and the fifth switch SW15 is turned on. The first test unit 140 applies the third lighting test signal DC_G to the third test signal line 142.

When the fan-out lines FOL1, FOL3, . . . adjacent to the fan-out lines FOL2, FOL4, . . . , to which the fifth switch SW15 is connected, have a certain current value or voltage value, the fan-out lines may be determined to have short-circuits.

Figure 10:
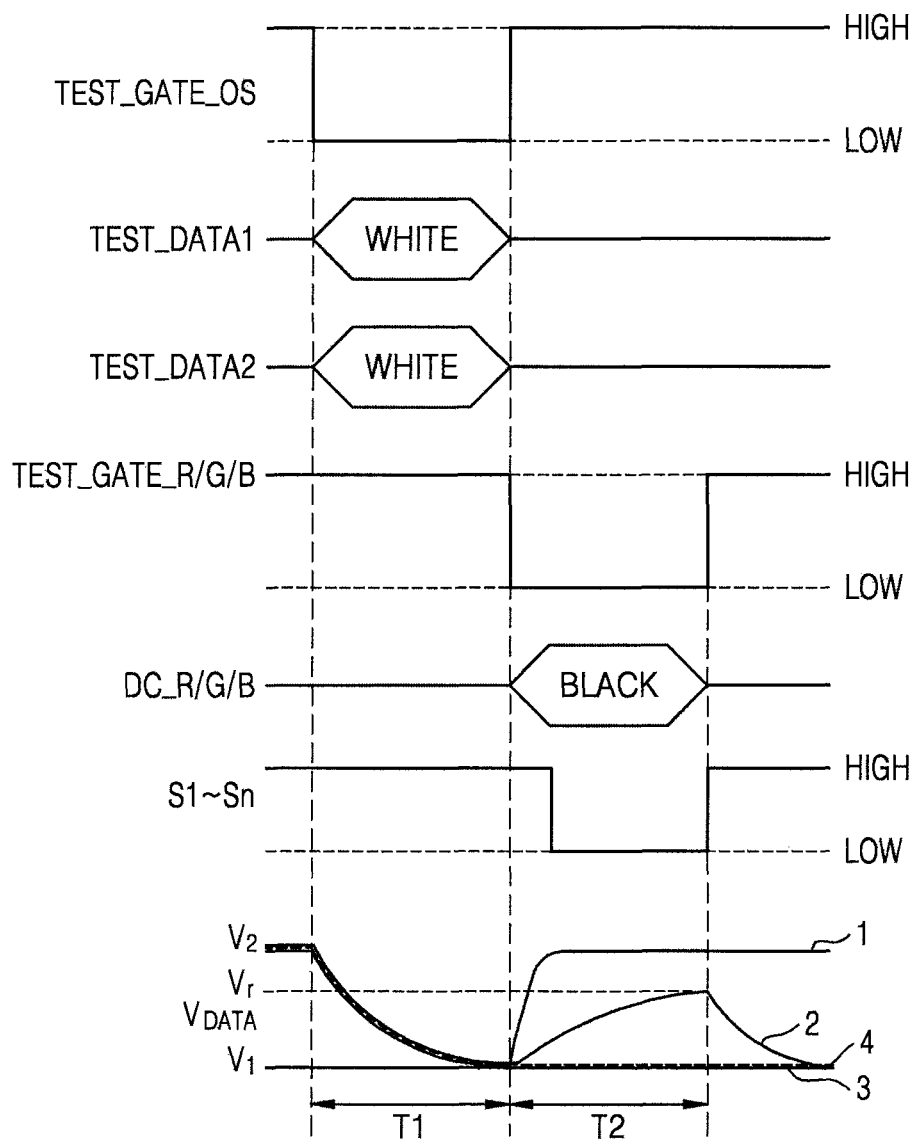
FIG. 10 is a timing diagram for explaining a test process for detecting an open circuit in the display device of FIG. 4.

FIG. 10 is a timing diagram for explaining a test process for detecting an open circuit in the display device 100 of FIG. 4.

Referring to FIG. 10, the detection of an open circuit of the fan-out line and/or data line may be performed by the first test unit 140 and the second test unit 150. Furthermore, in the present embodiment, simultaneously with the detection of an open circuit, a defect of the first test unit 140 may be detected.

First, in a first section T1 (e.g., a section of time), the line test control signal TEST_GATE_OS of a low level is applied to the gates of the sixth switch SW21, the seventh switch SW22, the eighth switch SW23, and the ninth switch SW24, and thus the sixth switch SW21 to the ninth switch SW24 are turned on. The first gradation data that is a white gradation may be applied to the fourth test signal line 152 and the fifth test signal line 155 as the first line test signal TEST_DATA1 and the second line test signal TEST_DATA2. The data lines DL1 to DLm may be controlled to have a first voltage V1 corresponding to the first gradation data.

Next, in a second section T2 (e.g., a section of time), the first to third lighting test control signals TEST_GATE_R, TEST_GATE_B, and TEST_GATE_G of a low level are applied to the gates of the first switch SW11 to the fifth switch SW15, and thus the first switch SW11 to the fifth switch SW15 are turned on. The second gradation data that is a black gradation may be applied to the first to third test signal lines 144, 146, and 142 as the first to third lighting test signals DC_B, DC_R, and DC_G. Accordingly, the data lines DL1 to DLm may be controlled to have the second voltage V2 corresponding to the second gradation data. In this state, scan signals S1 to Sn are sequentially supplied to the respective pixels PX through the scan lines SL1 to SLn.

The pixels PX connected to the data line corresponding to a normal fan-out line emit light at a brightness corresponding to a second voltage V2 (1). The pixels PX connected to the data line corresponding to the fan-out line having a resistance defect emit light at a brightness corresponding to a voltage Vr that is lower than the second voltage V2 (2). The pixels PX connected to the data line corresponding to the fan-out line that is open (e.g., an open circuit) do not receive the gradation data (3).

When the second switch SW12 and the fourth switch SW14 arranged at the edge among the first switch SW11 to the fifth switch SW15 of the first test unit 140 are damaged by the ESD, an open circuit may be detected. However, when even the first switch SW11 and the third switch SW13 are additionally damaged by the ESD are damaged, the detection of an open circuit is impossible.

In other words, when the pixels PX connected to the data lines corresponding to the first column and the third column show no voltage change in the second section T2 (4), the first switch SW11, the second switch SW12, the third switch SW13, and the fourth switch SW14 connected to the fan-out lines corresponding to the first column and the third column among the first switch SW11 to the fifth switch SW15 are determined to be damaged, and thus the display device 100 may be classified to be defective.

Furthermore, when the pixels PX connected to the data lines corresponding to the second column and the fourth column show no voltage change in the second section T2 (4), the fifth test switch SW15 may be determined to be damaged, and thus the display device 100 may be classified to be defective.

Figure 11:
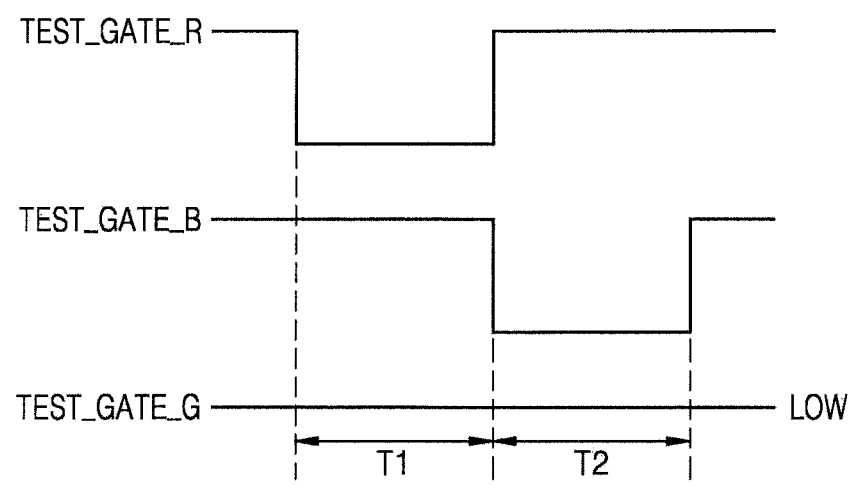
FIG. 11 is a timing diagram for explaining a lighting test in the display device of FIG. 4.

FIG. 11 is a timing diagram for explaining a lighting test in the display device of FIG. 4.

Referring to FIG. 11, during a lighting test, the second test unit 150 is deactivated. In other words, the line test control signal TEST_GATE_OS and the first and second line test signals TEST_DATA1 and TEST_DATA2 of a high level may be applied to the second test unit 150.

In the first section T1 (e.g., a section of time), the first lighting test control signal TEST_GATE_R of a low level is applied to the gates of the first switch SW11 and the fourth switch SW14, and thus the first switch SW11 and the fourth switch SW14 are turned on. The first lighting test signal DC_B is applied to the corresponding data line (e.g., the data line corresponding to the first fan-out line FOL1) via the first switch SW11, and the second lighting test signal DC_R is applied to the corresponding data line (e.g., the data line corresponding to the third fan-out line FOL3) via the fourth switch SW14.

In the second section T2 (e.g., a section of time), the second lighting test control signal TEST_GATE_B of a low level is applied to the gates of the second switch SW12 and the third switch SW13, and thus the second switch SW12 and the third switch SW13 are turned on. The second lighting test signal DC_R is applied to the corresponding data line (e.g., the data line corresponding to the first fan-out line FOL1) via the second switch SW12, and the first lighting test signal DC_B is applied to the corresponding data (e.g., the data line corresponding to the third fan-out line FOL3) line via the third switch SW13.

In the first section T1 and the second section T2, the third lighting test control signal TEST_GATE_G of a low level is applied to the gate of the fifth switch SW15, and thus the fifth switch SW15 is turned on. The third lighting test signal DC_G is applied to the corresponding data (e.g., the data line corresponding to the second fan-out line FOL2) line via the fifth switch SW15.

Figure 12:
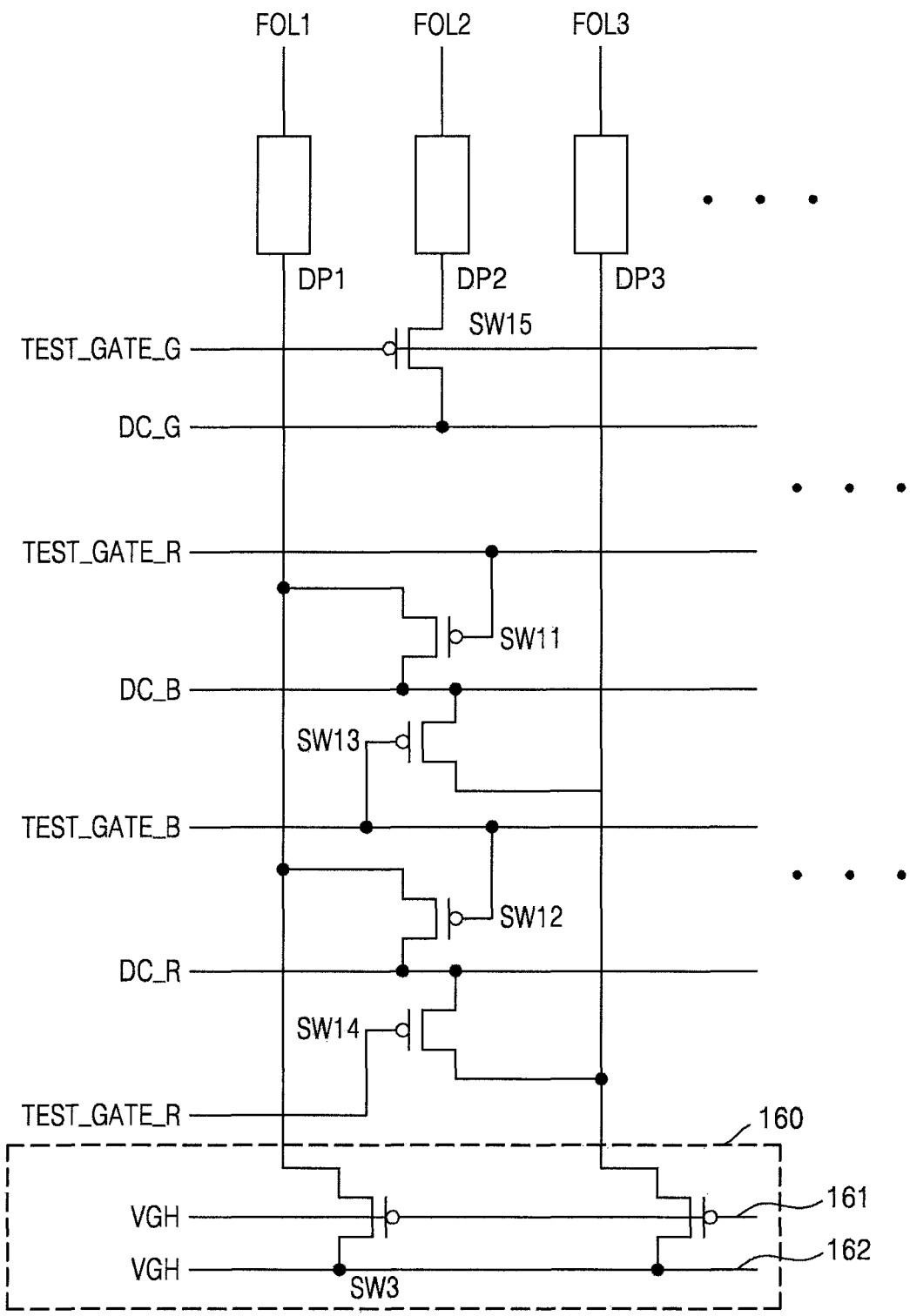
FIG. 12 illustrates a first test unit according to another embodiment.

FIG. 12 illustrates a first test unit according to another embodiment.

A first test unit according to the embodiment of FIG. 12 is different from the embodiment of FIG. 4 in that an electrostatic induction unit 160 is connected to the first test unit 140.

The electrostatic induction unit 160 is arranged at the bottom of the first test unit. ESD introduced to the data line and/or the fan-out line in a manufacturing process or inspection process of display device may be introduced to the electrostatic induction unit 160. The electrostatic induction unit 160 may include an electrostatic induction element. The electrostatic induction element may be a transistor. The electrostatic induction unit 160 may include a plurality of transistors arranged in parallel.

The electrostatic induction unit 160 may include a transistor SW3 connected to each of the fan-out line to which the first switch SW11 and the second switch SW12 are connected and the fan-out line to which the third switch SW13 and the fourth switch SW14 are connected (e.g., the electrostatic induction unit 160 may include a plurality of transistors SW3 and each fan-out line may be connected to a separate transistor SW3). In the transistor SW3, a gate is connected to a first dummy line 161, a first terminal is connected to the fan-out line, and a second terminal is connected to a second dummy line 162.

The electrostatic induction unit 160 maintains the transistor SW3 (e.g., the plurality of transistors SW3) in a turn-off state by applying a voltage VGH of a high level to the first dummy line 161 and the second dummy line 162. Accordingly, a short-circuit between adjacent fan-out lines due to the ESD may be prevented.

As described above, according to the present embodiments, the source electrodes of a pair of test transistors connected to a column (for example, an RB pixel column) in which two different pixels are alternately arranged are separated, and arranged in a column direction alternately with a pair of test transistors in an adjacent RB pixel column. Accordingly, as ESD occurs, the ESD is induced only to one of a pair of transistors, a normal lighting test is possible and a probability of defectiveness of a display device may be reduced.

In addition, in the display device according to the present embodiments, a probability of defectiveness of the test unit arranged at the edge of the display device due to the introduction of ESD may be reduced.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:
1. A display device comprising:
 a display unit comprising first pixels and second pixels alternately arranged in each of a first column and a third column, and third pixels arranged in a second column between the first column and the third column, wherein the first pixels and the second pixels are alternately arranged in the third column in an order reverse to that of the first column; and
a first test unit arranged around the display unit, and comprising a first transistor and a second transistor connected to a first fan-out line corresponding to a data line of the first column, and a third transistor and a fourth transistor connected to a third fan-out line corresponding to a data line of the third column,
wherein the first transistor to the fourth transistor are arranged in a first direction, and the third transistor or the fourth transistor are arranged between the first transistor and the second transistor.

2. The display device of claim 1, wherein, among the first transistor, the second transistor, the third transistor, and the fourth transistor, the first transistor is arranged farthest from an edge of the display device, and
the third transistor or the fourth transistor that is not arranged between the first transistor and the second transistor is arranged closest to the edge of the display device.

3. The display device of claim 1, further comprising:
a first control line arranged in a second direction that crosses the first direction;
a second control line arranged parallel to the first control line;
a third control line arranged parallel to the second control line;
a first test signal line arranged between the first control line and the second control line; and
a second test signal line arranged between the second control line and the third control line,
wherein the second control line and the third control line are electrically connected to each other.

4. The display device of claim 3, wherein, in the first transistor, a gate electrode is connected to the first control line, a first electrode is connected via a contact portion to the first fan-out line arranged in the first direction, and a second electrode is connected to the first test signal line, and
in the second transistor, a gate electrode is connected to the second control line, a first electrode is connected via a contact portion to the first fan-out line, and a second electrode is connected to the second test signal line.

5. The display device of claim 3, wherein, in the third transistor, a gate electrode is connected to the second control line, a first electrode is connected via a contact portion to the third fan-out line arranged in the first direction, and a second electrode is connected to the first test signal line, and
in the fourth transistor, a gate electrode is connected to the third control line, a first electrode is connected via a contact portion to the third fan-out line, and a second electrode is connected to the second test signal line.

6. The display device of claim 3, wherein each of the first transistor and the third transistor shares the first test signal line as one electrode.

7. The display device of claim 3, wherein each of the second transistor and the fourth transistor shares the second test signal line as one electrode.

8. The display device of claim 3, further comprising:
a fourth control line arranged parallel to the first control line; and
a third test signal line arranged between the first control line and the fourth control line,
wherein the fourth control line is arranged closer to the display unit than the first control line.

9. The display device of claim 8, wherein the first test unit further comprises a fifth transistor in which a gate is connected to the fourth control line, a first electrode is connected to a second fan-out line corresponding to a data line of the second column, and a second electrode is connected to the third test signal line.

10. The display device of claim 1, further comprising an electrostatic induction unit connected to the first test unit.

11. The display device of claim 10, wherein the electrostatic induction unit comprises sixth transistors, each connected to the first fan-out line or the third fan-out line and maintaining a turn-off state.

12. The display device of claim 1, further comprising a second test unit connected to the first test unit,
wherein the second test unit comprises:
a seventh transistor connected to the first fan-out line;
an eighth transistor connected to a second fan-out line corresponding to a data line of the second column;
a ninth transistor connected to the third fan-out line; and
a tenth transistor connected to a fourth fan-out line corresponding to a data line of a fourth column next to the third column,
wherein the seventh transistor and the eighth transistor are connected to a fourth test signal line that applies a fourth test signal, and
the ninth transistor and the tenth transistor are connected to a fifth test signal line that applies a fifth test signal.

13. The display device of claim 12, wherein a data pad is arranged between the first test unit and the second test unit.

14. A method of testing a display device, the display device comprising a display unit, and a first test unit and a second test unit around the display unit, wherein the display unit comprises first pixels and second pixels alternately arranged in each of a first column and a third column, and third pixels arranged in a second column between the first column and the third column and in a fourth column adjacent to the third column, wherein the first pixels and the second pixels are alternately arranged in the third column in an order reverse to that of the first column, the method comprising:
applying first gradation data to data lines of the first column, the second column, the third column, and the fourth column via the second test unit in a first section;
applying second gradation data to data lines of the first column, the second column, the third column, and the fourth column via the first test unit in a second section; and
applying a scan signal to the display unit in the second section, wherein the first test unit comprises a first transistor and a second transistor connected to a first fan-out line corresponding to a data line of the first column, and a third transistor and a fourth transistor connected to a third fan-out line corresponding to a data line of the third column, and
the first transistor, the second transistor, the third transistor, and the fourth transistor are arranged in a first direction, and the third transistor or the fourth transistor is arranged between the first transistor and the second transistor.

15. The method of claim 14, wherein, among the first transistor, the second transistor, the third transistor, and the fourth transistor, the first transistor is arranged farthest from an edge of the display device, and
the third transistor or the fourth transistor that is not arranged between the first transistor and the second transistor is arranged closest to the edge of the display device.

16. The method of claim 14, wherein one electrode of the first transistor and one electrode of the second transistor are connected to the first fan-out line via a contact portion, and one electrode of the third transistor and one electrode of the fourth transistor are connected to the third fan-out line via a contact portion.

17. The method of claim 14, wherein the first test unit further comprises a fifth transistor connected to a second fan-out line corresponding to a data line of the second column.

18. The method of claim 14, further comprising an electrostatic induction unit connected to the first test unit.

19. The method of claim 18, wherein the electrostatic induction unit further comprises sixth transistors, each connected to the first fan-out line or the third fan-out line and maintaining a turn-off state.

* * * * *